United States Patent
Xia et al.

[19]

[11] Patent Number: 6,057,672

[45] Date of Patent: May 2, 2000

[54] CONTROL SIGNAL PROCESSOR AND POWER SYSTEM STABILIZER USING THE SAME

[75] Inventors: Yuou Xia; Masaru Shimomura, both of Tokyo, Japan

[73] Assignee: Mitsubishi Denki Kabushiki Kaisha, Tokyo, Japan

[21] Appl. No.: 09/186,162

[22] Filed: Nov. 5, 1998

[30] Foreign Application Priority Data

Jun. 3, 1998 [JP] Japan .................................. 10-154951

[51] Int. Cl.[7] .............................. H02H 7/06; H02K 11/00
[52] U.S. Cl. ................................. 322/58; 322/19; 322/23
[58] Field of Search ................... 322/58, 32, 29

[56] References Cited

U.S. PATENT DOCUMENTS

| | | | |
|---|---|---|---|
| 4,788,653 | 11/1988 | Henderson et al. | 322/58 |
| 4,967,129 | 10/1990 | Tanaka | 322/58 |
| 5,604,420 | 2/1997 | Nambu | 322/19 |
| 5,698,968 | 12/1997 | Takagi et al. | 322/58 |

FOREIGN PATENT DOCUMENTS

| | | |
|---|---|---|
| 2262843 | 10/1990 | Japan . |
| 9252538 | 9/1997 | Japan . |

OTHER PUBLICATIONS

Coowar et al, "Decoupling Negative Damping Signals in a Power System Through Dynamic Gain Reduction Measures," Feb. 1991 IEEE, entire document.

Sekita et al, "A New Design Method for Digital PSS," Apr. 1998 IEEE, entire document.

*Primary Examiner*—Nestor Ramirez
*Assistant Examiner*—Peter Medley
*Attorney, Agent, or Firm*—Leydig, Voit & Mayer

[57] ABSTRACT

A control signal processor effects control to permit or inhibit the passage of an input signal, by a logic operation, based on a ratio of input and output signals of a filter circuit having a double differentiation function characteristic.

8 Claims, 4 Drawing Sheets

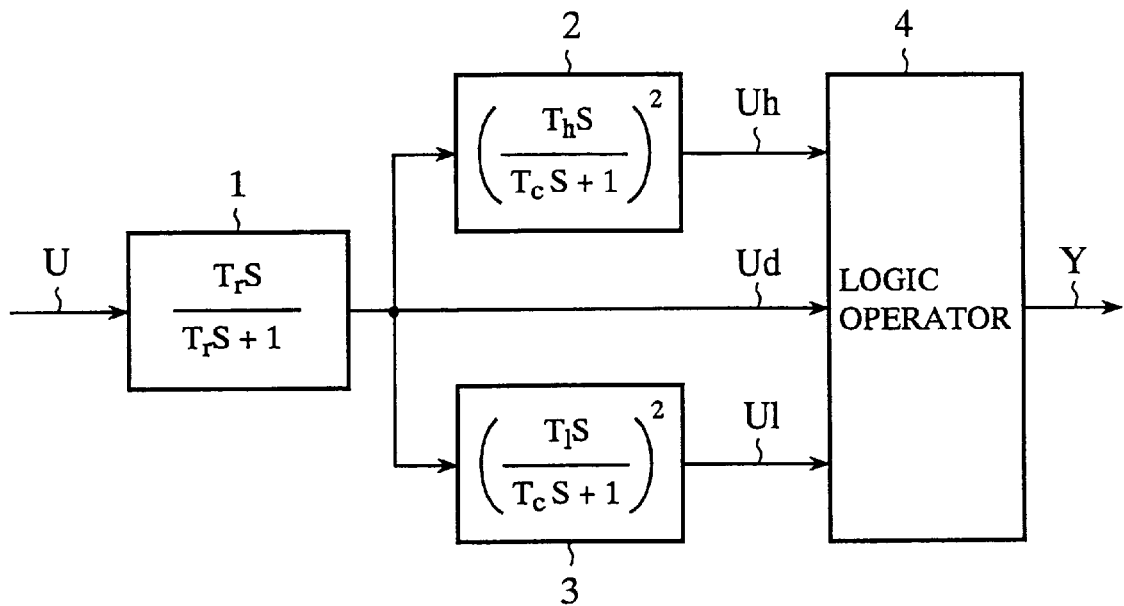
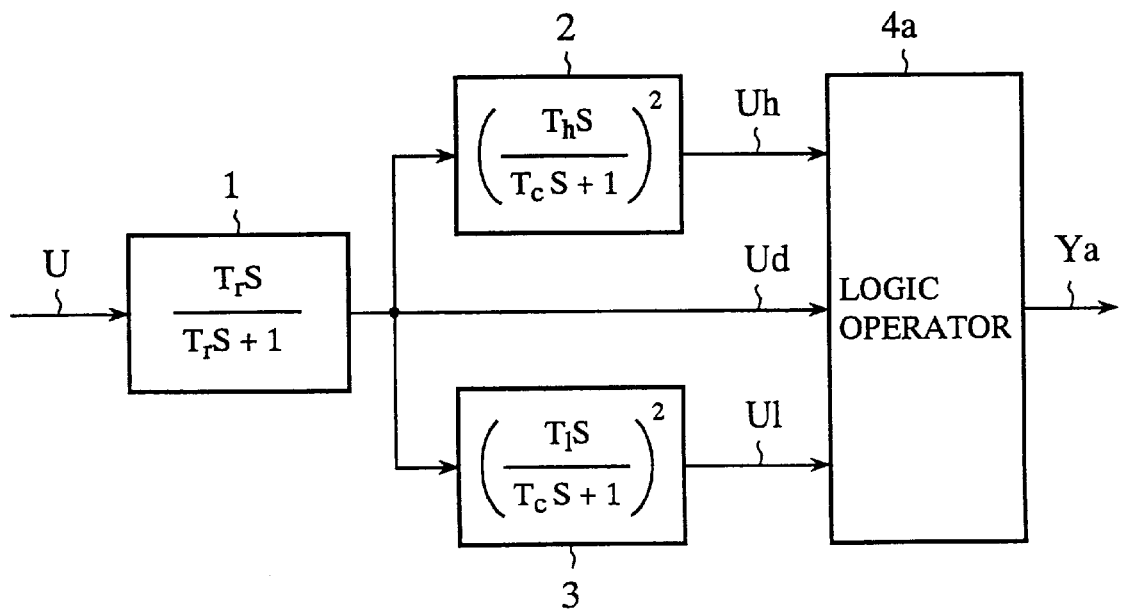

CONTROL SIGNAL PROCESSOR AND POWER SYSTEM STABILIZER USING THE SAME

BACKGROUND OF THE INVENTION

The present invention claims priority under 35 U.S.C. §§ 119 and/or 365 to Hei 10-154951 filed in Japan on Jun. 3, 1998, the entire content of which is herein incorporated by reference.

1. Field of the Invention

The present invention relates to a control signal processor for processing control signals as in an excitation system of a generator and a power system stabilizer (hereinafter sometimes referred to as "PSS") using the control signal processor.

2. Description of the Prior Art

In the generator excitation system, a deviation (from a reference value) of a terminal voltage of the generator has heretofore been used as a control signal of an automatic voltage regulator (hereinafter sometimes referred to as "AVR") which holds the generator voltage constant. Further, a deviation of the active power of the generator, a deviation of the rotational speed of the generator, and a frequency deviation of the generator voltage are commonly used as PSS control signals for suppressing variations in the quality or state of the voltage and active power of the generator due to an accident in the power system. These deviation signals may sometimes vary from their steady-state values owing to measurement noise and mechanical vibrations and changes of operating conditions. Such noise and varying components are detrimental components of the AVR or PSS control signal, and unless removed, they may cause a malfunction of the automatic voltage regulator AVR or power system stabilizer PSS.

Since the frequency of power system oscillation modes are generally within a certain range (about 0.1 to 3 Hz), the conventional control signal processor uses only an input signal having a frequency within the specified frequency range, as an effective control signal, and attenuates the other frequency components, thereby removing the abovementioned detrimental components.

To attenuate such harmful components, it is general practice in the art to employ, as a control signal processor, a high-frequency filter which has a transfer function of 1/(TS+1) (where T is a constant and S a Laplace variable) as shown in FIG. 7, or a low-frequency filter which has a transfer function of TS/(TS+1) as shown in FIG. 8. These filters are implemented by a variety of circuits from simple analog circuits to complex digital circuits. The basic feature of these filters is to attenuate some of frequency components of all input signals or to separate the frequency components according to modes and pass them or attenuate them for each mode. The higher the accuracy of the filter, the more complex its circuit configuration and the slower its response.

FIG. 9 illustrates in block form a conventional power system stabilizer. Reference numeral 90 denotes an input signal indicating the rotational speed of the generator; 91 denotes a high-frequency filter which attenuates the high-frequency component, such as shown in FIG. 7; 92 denotes a phase compensator which compensates for all phases of the high-frequency filter 91 of the preceding stage, a low-frequency filter 93 of the following stage and the automatic voltage regulator AVR into which the output signal of the power system stabilizer PSS is input; 93 denotes the low-frequency filter which attenuates the low-frequency component, such as depicted in FIG. 8; 94 denotes an amplifier for amplifying the level of the output signal from the low-frequency filter; 95 denotes a limiter for limiting the output signal level of the amplifier 94 to a predetermined range of voltage level; and 96 denotes the PSS output signal, which is input into the automatic voltage regulator AVR not shown.

Next, the operation of the prior art example will be described.

The input signal 90 is processed to remove its high-frequency noise component and varying component, and its phase delay with the high-frequency filter 91, the low-frequency filter 93, and the phase comparator 92. The output signal from the phase compensator 92 is fed to the low-frequency filter 93, wherein its low-frequency noise component and varying component are removed by the low-frequency filter 93. The filter output is amplified by the amplifier 94 and converted by the limiter 95 to a signal within a predetermined range of voltage levels, which is provided therefrom as the output signal 96.

In the conventional power system stabilizer PSS, it is necessary that a phase delay of the automatic voltage regulator AVR, other than the phase delay by the high-frequency filter 91 and the low-frequency filter 93 be compensated by the phase compensator 92. Further, to maintain good control efficiency in the frequency region in which power varies, the output level also needs to have suitable values. With the conventional configuration, however, it is difficult to satisfy all the requirements, no matter how precisely the PSS parameters are controlled.

The conventional control signal processor and the power system stabilizer using the processor are constructed as described above, and hence they have such problems as listed below.

1. When noise superimposed on the control signal and its varying high- or low-frequency components are attenuated by the high- and low-frequency filters, the phase of the signal within the effective signal range will shift; since it is difficult in many cases to fulfil the aim of control while compensating for the phase shift, much difficulty is encountered in constructing the optimum control system. A filter of the type that does not cause a phase shift may be available, but its application is impractical because of complex configuration and low response speed or expensive.

2. Since all input signals are applied to filters, a wide frequency range of the effective control signal allows easy incorporation thereinto of unwanted harmful components, whereas a narrow frequency range incurs attenuation of the high- or low-frequency component contained in the effective control signal, too, lessening the effect of control.

3. Noise by torsional vibrations of the generator shaft is a harmful component, but since its frequency is close to the local oscillation frequency of the generator, its attenuation is also accompanied by the attenuation of the local oscillation component that is the effective control signal.

The solution of these problems requires a control signal processor which eliminates harmful components and, at the same time, does not deform the effective control signal but is simple in circuit configuration and fast in response.

SUMMARY OF THE INVENTION

It is therefore an object of the present invention to provide a control signal processor which completely interrupts noise, variations and similar harmful components, allows the passage therethrough of the effective control signal intact and permits removal of the harmful components without affecting the effective control signal, and a simple-structured, reliable and high-practicality power system stabilizer which is capable of compensating for the excitation system to enable the generator to keep an appropriate damping force against every power oscillation and which has a wide range of stabilization and a high degree of robustness.

To attain the above objective, according to a first aspect of the present invention, there is provided a control signal processor which performs control to decide whether to permit or inhibit the passage therethrough of an input signal by a logical operation based on the level ratio between input and output signals of a filter circuit having a double differentiation function characteristic. This simple-structured, fast-response control signal processor completely cuts off noise, variations and similar harmful components but permits the passage therethrough of the effective control signal intact; hence, it is possible to remove the harmful components without affecting the effective control signal.

According to a second aspect of the present invention, there is provided a control signal processor which performs a logic operation that allows the passage of a frequency component of the input signal between first and second boundary values. This permits removal of low- and high-frequency noises without causing a phase shift in the input signal.

According to a third aspect of the present invention, there is provided a control signal processor which performs a logic operation that permits the passage of frequency components of the input signal larger than a first boundary value and smaller than a second boundary value, respectively. This allows effective removal of noise which is caused by torsional vibrations of the generator shaft at a frequency close to the frequency range of the effective control signal.

According to a fourth aspect of the present invention, there is provided a power system stabilizer whereby the output signal from a control signal processor, which performs control as to whether to permit or inhibit the passage therethrough of the input frequency component by a logic operation based on the input-output ratio of a filter with a double differentiation function characteristic, is subjected to gain and phase compensation in accordance with a transfer function of a predetermined characteristic obtained by setting damping torque of the generator at suitable values and reducing synchronous torque by the PSS effect to zero. By this, it is possible with a simple circuit arrangement to compensate for the excitation system so that the generator maintains an appropriate damping torque against every power oscillation. Hence, the power system stabilizer has a wide range of stabilization, robustness, high reliability and high practicality.

According to a fifth aspect of the present invention, there is provided a power system stabilizer which limits the value of the control signal to the output level within a predetermined range. Hence, the power system stabilizer has broad applicability and high reliability.

According to a sixth aspect of the present invention, there is provided a power system stabilizer in which transfer functions for gain and phase compensations are approximated by one or more stages of leading/lagging functions. By this, it is possible with a simple circuit arrangement to compensate, with high accuracy, for the phase and gain of the input signal affected by a deviation of the rotational speed of the generator or frequency deviation of the generator voltage.

According to a seventh aspect of the present invention, there is provided a power system stabilizer in which transfer functions for gain and phase compensations are approximated by one of more stages of leading/lagging functions and an integration function. By this, it is possible with a simple circuit arrangement to compensate for the phase and gain of the input signal affected by a deviation of the active power of the generator.

According to an eighth aspect of the present invention, there is provided a power system stabilizer in which a control signal processor performs either one or both of a logical operation that allows the passage therethrough of a frequency component of the input signal between first and second boundary values and a logical operation that allows the passage therethrough of frequency components of the input signal larger than the first boundary value and smaller than the second boundary value, respectively. By this, it is possible to remove harmful components while holding the effective control signal intact; hence, the power system stabilizer is high in safety and in reliability, though simple-structured.

BRIEF DESCRIPTION OF THE DRAWINGS

The other objects, features and advantages of the present invention will become more apparent from the following detailed description taken in conjunction with the accompanying drawings, in which:

FIG. 1 is a block diagram illustrating a control signal processor according to a first embodiment of the present invention;

FIG. 2 is a block diagram illustrating a control signal processor according to a second embodiment of the present invention;

DETAILED DESCRIPTION OF THE PREFERRED EMBODIMENTS

Figure 3:
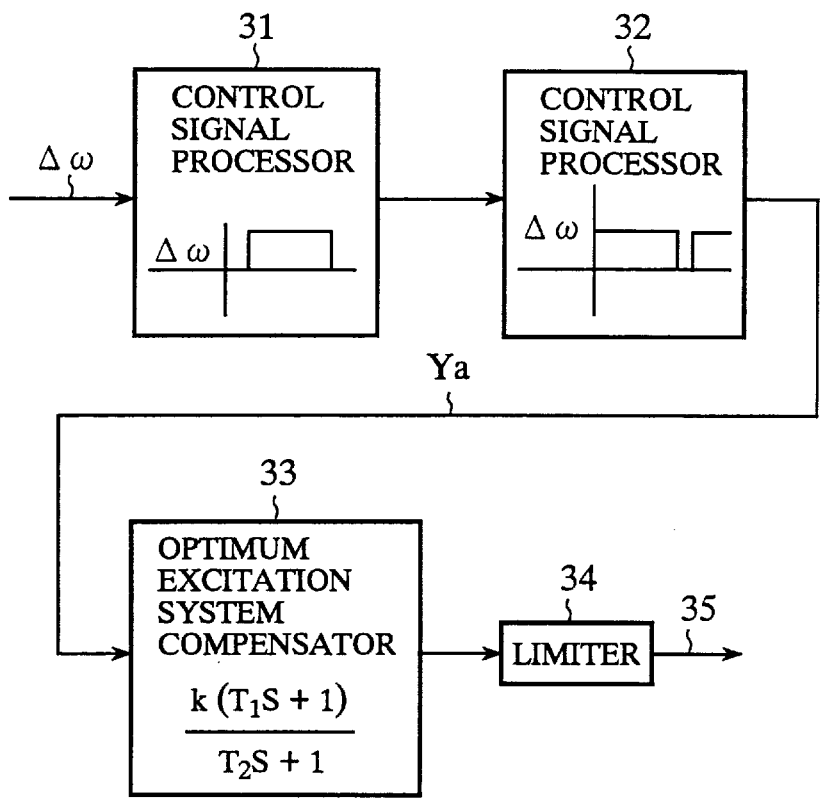
FIG. 3 is a block diagram illustrating a power system stabilizer according to a third embodiment of the present invention.

A detailed description will be given, with reference to the accompanying drawings, of the preferred embodiments of the present invention.

EMBODIMENT 1

FIG. 1 illustrates in block form a control signal processor according to a first embodiment (Embodiment 1) of the present invention. In FIG. 1, reference character U denotes a signal (an input signal) which is input into the control signal processor, and 1 denotes a deviation resetter for attenuating the signal U when its deviation from a reference value is considered to be a constant deviation, the resetter including an incomplete differentiation circuit whose transfer function is $T_rS/(T_rS+1)$ (where $T_r$ is a constant and S is a Laplace variable). $U_d$ denotes a signal which is output from the deviation resetter 1, and 2 denotes a high-frequency detector (a first filter circuit) which increases the values of the frequency components of the signal $U_d$ higher than a predetermined high frequency (a first boundary value) and attenuates the values of the frequency components of the signal lower than the predetermined high frequency and provides the output signals in opposite phases. The high-frequency detector 2 has the transfer function characteristic of a double differentiation function, the transfer function of which is $[T_hS/(T_cS+1)]^2$ (where $T_h$ is a constant for defining the high frequency, i.e. the first boundary value, and $T_c$ is a very small constant). Reference numeral 3 denotes a low-frequency detector (a second filter circuit) which increases the values of the frequency components of the signal $U_d$ higher than a predetermined low frequency (a second boundary value) and attenuates the values of the frequency components of the signal lower than the predetermined low frequency and provides the output signals in opposite phases. The low-frequency detector 3 has the transfer function characteristic of a double differentiation function, the transfer function of which is $[T_lS/(T_cS+1)]^2$ (where $T_l$ is a constant for defining the high frequency, i.e. the second boundary value, and $T_c$ is a very small constant). $U_h$ denotes a signal that is output from the high-frequency detector 2; $U_l$ denotes a signal that is output from the low-frequency detector 3; 4 denotes a logic operator (a logic circuit) which receives the signals $U_d$, $U_h$ and $U_l$ and performs predetermined processing for these signals; and Y denotes a signal that is output from the logic operator 4. The deviation resetter 1 need not be provided when it is expected that the constant deviation of the signal U can be disregarded.

Next, the operation of this embodiment will be described below.

The signal U is input into the deviation resetter 1, wherein its constant deviation is removed and from which it is output as the signal $U_d$. The signal $U_d$ is fed into the high-frequency detector 2, the low-frequency detector 3 and the logic operator 4.

The high-frequency detector 2 outputs the signal $U_h$ which is an amplified version of the input signal $U_d$ such that its gain is smaller than 1 at frequencies below a predetermined frequency of the high-frequency region and, 1 at the predetermined frequency, and larger than 1 at frequencies above the predetermined frequency. The output signal $U_h$ is 180° out of phase with a given frequency component of the input signal $U_d$. The output signal $U_h$ is input to the logic operator 4. The low-frequency detector 3 outputs the signal $U_l$ which is an amplified version of the input signal $U_d$ such that its gain is smaller than 1 at frequencies below a predetermined frequency of the low-frequency region and 1 at the predetermined frequency and larger than 1 at frequencies above the predetermined frequency. The output signal $U_l$ is 180° out of phase with a given frequency component of the input signal $U_d$. The output signal $U_l$ is also applied to the logic operator 4.

The logic operator 4 performs the following logical arithmetic processing of the signals $U_d$, $U_h$ and $U_l$ inputted thereto, generating the signal Y.

IF $\text{Log}10\,(|U_h|/|U_d|) < C_f$ then $Y_1 = 1$, else $Y_1 = 0$;

IF $\text{Log}10\,(|U_l|/|U_d|) > C_f$ then $Y_2 = 1$, else $Y_2 = 0$;

$Y = U_d \times Y_1 \times Y_2$

In the above, $C_f$ is a predetermined reference value, which is set not at zero but at a small value corresponding to the required accuracy of control signal processing, taking into account the influence of other frequency components than the main component contained in the signal U that is input to the control signal processor.

The logic operator 4 obtains a signal $Y_1$ at the 1 level when the signal $U_h$ is smaller than $10^{Cf}$ times the value of the signal $U_d$ and at the 0 level when the former is equal to or larger than the latter. Similarly, the logic operator 4 obtains a signal $Y_2$ at the 1 level when the signal $U_l$ is larger than $10^{Cf}$ times the value of the signal $U_d$ and at the 0 level when the former is equal to or larger than the latter.

The logic operator 4 ultimately outputs the signal U as the signal Y only when the signals $Y_1$ and $Y_2$ are both at the 1 level.

The operation and output effect of the logic operator 4 may be summarized in brief as given in the following table 1.

TABLE 1

| FUNDAMENTAL FREQUENCY $\omega$ OF INPUT SIGNAL | INPUTS TO RESPECTIVE PARTS | | OUTPUTS FROM RESPECTIVE PARTS | | DEVICE OUTPUT Y |
|---|---|---|---|---|---|
| | $U_h$ | $U_l$ | $Y_1$ | $Y_2$ | |
| $\omega > \omega_h$ | $|U_h| > k_f|U|$ | $|U_l| > K_f|U|$ | 0 | 1 | 0 |
| $\omega < \omega_l$ | $|U_h| < k_f|U|$ | $|U_l| < K_f|U|$ | 1 | 0 | 0 |
| $\omega_h > \omega > \omega_l$ | $|U_h| < k_f|U|$ | $|U_l| > K_f|U|$ | 1 | 1 | U |

$Y = U \times Y_1 \times Y_2$

OUTPUT EFFECT: graph of Y vs $\omega$ showing output U during output period between $\omega_l$ and $\omega_h$.

its gain is smaller than 1 at frequencies below a predetermined frequency of the high-frequency region and, 1 at the predetermined frequency, and larger than 1 at frequencies above the predetermined frequency. The output signal $U_h$ is 180° out of phase with a given frequency component of the In Table 1, $\omega$ is the fundamental frequency of the signal U, $\omega_h$ is a high-frequency boundary value (a first boundary value) that is a frequency at which the level of the signal $U_h$ output from the high-frequency detector 2 becomes equal to the level of the signal $U_d$ input thereto, $\omega_l$ is a low-frequency boundary value (a second boundary value) that is a frequency at which the level of the signal $U_l$ output from the low-frequency detector 3 becomes equal to the level of the signal $U_d$ input thereto, and $K_f$ is a constant corresponding to the constant $C_f$.

As shown in Table 1, when the fundamental frequency $\omega$ is higher than the high-frequency boundary value $\omega_h$, the level of the signal $U_h$ is higher than the signal level $K_f$ times that of the signal U, providing the signal $Y_1$ at the 0 level, whereas the level of the signal $U_l$ is also higher than the signal level $K_f$ times that of the signal U, providing the signal $Y_2$ at the 1 level. Consequently, the signal Y goes to the 0 level.

When the fundamental frequency $\omega$ is lower than the low-frequency boundary value $\omega_l$, the level of the signal $U_h$ is lower than the signal level $K_f$ times that of the signal U, providing the signal $Y_1$ at the 1 level, whereas the level of the signal $U_l$ is also lower than the signal level $K_f$ times that of the signal U, providing the signal $Y_2$ at the 0 level. Consequently, the signal Y goes to the 0 level.

When the fundamental frequency $\omega$ is lower than the high-frequency boundary value $\omega_h$ but higher than the low-frequency boundary value $\omega_l$, the level of the signal $U_h$ becomes lower than the signal level $K_f$ times that of the signal U, providing the signal $Y_1$ at the 1 level, whereas the level of the signal $U_l$ becomes higher than the signal level $K_f$ times that of the signal U, providing the signal $Y_2$ at the 1 level. Consequently, the signal U is output as the signal Y.

To sum up, the signal U is output as the signal Y only when the fundamental frequency $\omega$ of the signal U stays between the low- and high-frequency boundary values $\omega_1$ and $\omega_2$ as depicted in the last cell of Table 1.

As described above, Embodiment 1 uses the high- and low-frequency detectors 2 and 3 each having the double differentiation function characteristic, and performs filtering by the logic operation of the logic operator 4. Hence, low-cost, high-speed removal of the high- and low-frequency harmful components can be accomplished without exerting any influence on the effective control signal.

EMBODIMENT 2

FIG. 2 illustrates in block form a control signal processor according to a second embodiment (Embodiment 2) of the present invention. In FIG. 2 the parts corresponding to those in Embodiment 1 of FIG. 1 are identified by the same reference numerals as in the latter, and no description will be given of them. Reference numeral $4_a$ denotes a logic operator (a logic circuit) which inputs thereinto the signals $U_d$, $U_h$ and $U_l$ and subjects them to predetermined processing; and $Y_a$ denotes a signal that is output from the logic operator $4_a$.

Now, the operation of this embodiment will be described below.

The logic operator $4_a$ subjects the input signals $U_d$, $U_h$ and $U_l$ input thereto to the following logic arithmetic processing, generating the signal $Y_a$.

IF $\text{Log10}(|U_h|/|U_d|) < C_f$ then $Y_1 = 1$, else $Y_1 = 0$;

IF $\text{Log10}(|U_l|/|U_d|) > C_f$ then $Y_2 = 1$, else $Y_2 = 0$;

$Y_a = U_d \times |Y_1 - Y_2|$

The logic operator $4_a$ obtains a signal $Y_1$ at the 1 level when the signal $U_h$ is smaller than $10^{Cf}$ times the value of the signal U and at the 0 level when former is equal to or larger than the latter. Similarly, the logic operator 4 obtains a signal $Y_2$ at the 1 level when the signal $U_l$ is larger than $10^{Cf}$ times the value of the signal U and at the 0 level when the former is equal to or larger than the latter.

The logic operator 4 ultimately outputs the signal U as the signal $Y_a$ when the signals $Y_1$ and $Y_2$ differ in value, and outputs the signal $Y_a$ at the 0 level when they have the same value.

The operation and output effect of the logic operator 4 may be summarized in brief as given in the following table 2.

TABLE 2

| FUNDAMENTAL FREQUENCY $\omega$ OF INPUT SIGNAL | INPUTS TO RESPECTIVE PARTS | | OUTPUTS FROM RESPECTIVE PARTS | | DEVICE OUTPUT Ya |
|---|---|---|---|---|---|
| | $U_h$ | $U_l$ | $Y_1$ | $Y_2$ | |
| $\omega > \omega_h$ | $|U_h| > K_f|U|$ | $|U_l| > K_f|U|$ | 0 | 1 | U |
| $\omega < \omega_l$ | $|U_h| < K_f|U|$ | $|U_l| < K_f|U|$ | 1 | 0 | U |
| $\omega_h > \omega > \omega_l$ | $|U_h| < K_f|U|$ | $|U_l| > K_f|U|$ | 1 | 1 | 0 |

$Y_a = U \times |Y_1 - Y_2|$

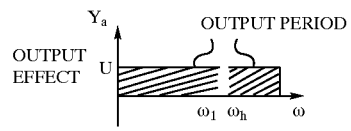

In Table 2, the same symbols as those in Table 1 indicate the same meanings as those in the latter; hence, no description will be repeated.

As shown in Table 2, when the fundamental frequency $\omega$ is higher than the high-frequency boundary value $\omega_h$, the level of the signal $U_h$ is higher than the signal level $K_f$ times that of the signal U, providing the signal $Y_1$ at the 0 level, whereas the level of the signal $U_l$ is also higher than the signal level $K_f$ times that of the signal U, providing the signal $Y_2$ at the 1 level. Consequently, the signal U is output as the signal $Y_a$.

When the fundamental frequency $\omega$ is lower than the low-frequency boundary value $\omega_l$, the level of the signal $U_h$ is lower than the signal level $K_f$ times that of the signal U, providing the signal $Y_1$ at the 1 level, whereas the level of the signal $U_l$ is also lower than the signal level $K_f$ times that of the signal U, providing the signal $Y_2$ at the 0 level. Consequently, the signal U is output as the signal $Y_a$.

When the fundamental frequency $\omega$ is lower than the high-frequency boundary value $\omega_h$ but higher than the low-frequency boundary value $\omega_l$, the level of the signal $U_h$ becomes lower than the signal level $K_f$ times that of the signal U, providing the signal $Y_1$ at the 1 level, whereas the level of the signal $U_l$ becomes higher than the signal level $K_f$ times that of the signal U, providing the signal $Y_2$ at the 1 level. Consequently, the signal $Y_a$ goes to the 0 level.

To sum up, as depicted in the last cell of Table 2, the output signal $Y_a$ goes to the 0 level only when the fundamental frequency ω of the signal U stays between the low- and high-frequency boundary values $\omega_1$ and $\omega_2$, and the signal U is output as the signal $Y_a$ when the fundamental frequency ω of the signal U is at the other frequencies.

As described above, Embodiment 2 permits low-cost, high-speed removal of harmful components within a predetermined frequency range without exerting any influence on the effective control signal as is the case with Embodiment 1.

EMBODIMENT 3

FIG. 3 is a block diagram depicting a power system stabilizer PSS according to a third embodiment (Embodiment 3) of the present invention. In FIG. 3, reference character Δω denotes a signal representing a deviation of the rotational speed of the generator, which is input into the power system stabilizer PSS; 31 denotes the control signal processor of Embodiment 1; and 32 denotes the control signal processor of Embodiment 2 connected in cascade to the control signal processor 31. The high-frequency boundary value $\omega_h$ of the high-frequency detector 2 and the low-frequency boundary value $\omega_l$ of the low-frequency detector 3 in the control signal processor 32 are set at values which eliminate noise frequencies resulting from torsional vibrations of the generator shaft but do not eliminate the effective control signal.

Reference numeral 33 denotes an optimum excitation system compensator (a compensation circuit) connected in cascade to the control signal processor 32, for maintaining an appropriate damping torque of the generator, the compensator having a transfer function $k(T_1S+1)/(T_2S+1)$; 34 denotes a limiter connected in cascade to the optimum compensator 33, for keeping its output signal level within a predetermined range; and 35 denotes a signal that is output from the limiter 34.

The optimum excitation system compensator 33 performs phase and gain compensations in the PSS to keep the damping torque of the generator at an appropriate value over the entire frequency region so as to suppress power oscillation at every oscillation frequency of the system. The transfer characteristic of the optimum excitation system compensator 33 will be described below.

Torque of the generator system is classified into damping torque and synchronous torque in a generator control system that define the damping force of the generator. The damping torque of the generator control system is the sum of system-inherent damping torque, damping torque by the effect of automatic voltage regulation (hereinafter referred to as an "AVR effect") and damping torque by the effect of power system stabilization (hereinafter referred to as a "PSS effect"). The synchronous torque of the generator control system is the sum of system-inherent synchronous torque, synchronous torque by the AVR effect and synchronous torque by the PSS effect, Generator control system damping torque:

$$T_d = T_{d\_SYS} + T_{d\_AVR} + T_{d\_PSS} \quad (1)$$

Generator control system synchronous torque:

$$T_k = T_{k\_SYS} + T_{k\_AVR} + T_{k\_PSS} \quad (2)$$

In the above, $T_{d\_SYS}$ is system-inherent damping torque (a constant), $T_{d\_AVR}$ is damping torque by the AVR effect (which is calculated in the AVR control block or the like), $T_{d\_PSS}$ is damping torque by the PSS effect, $T_{k\_SYS}$ is system-inherent synchronous torque (a constant), $T_{k\_AVR}$ is synchronous torque by the AVR effect (which is calculated in the AVR control block or the like), and $T_{k\_PSS}$ is synchronous torque by the PSS effect.

Figure 4:
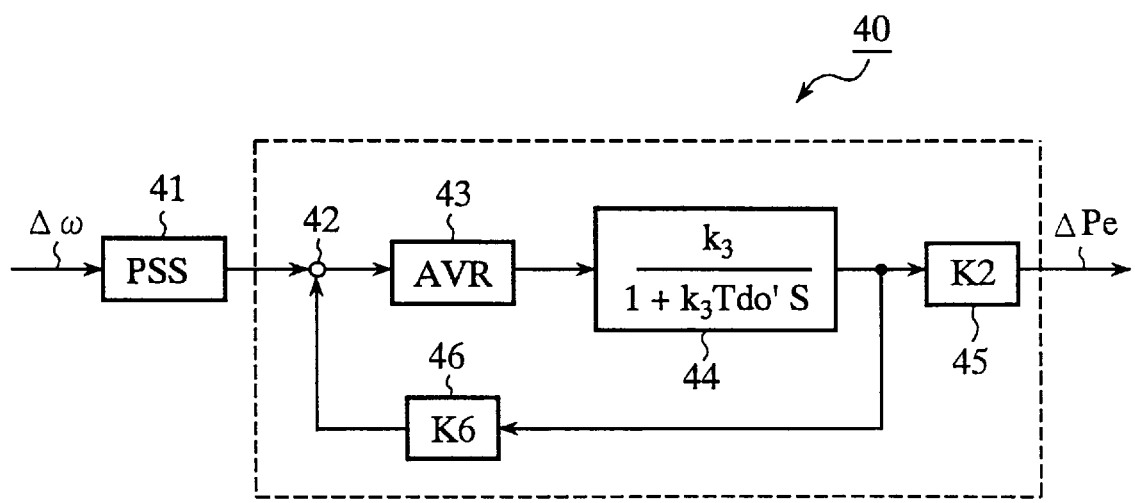
FIG. 4 is a block diagram showing a control block for calculating braking torque and synchronous torque based on the PSS effect in the third embodiment.

FIG. 4 depicts the control block for calculating the abovementioned damping torque $T_{d\_PSS}$ and synchronous torque $T_{k\_PSS}$ by the PSS effect. In FIG. 4, reference numeral 40 denotes an AVR-centered functional block; 41 denotes a PSS functional block; 42 denotes an adder; 43 denotes an AVR functional block; 44 denotes a functional block which provides a transfer function $k_3/(1+k_3T_{do'}S)$ (where $k_3$ is a constant parameter corresponding to the generator system, $T_{do'}$ is a time constant of the generator and S is a Laplace variable); 45 and 46 denote functional blocks representative of constant parameters K2 and K6 of the generator, respectively; and $\Delta P_\theta$ denotes a signal indicative of a deviation of the electrical output from the generator.

The damping torque $T_{d\_PSS}$ and synchronous torque $T_{k\_PSS}$ by the PSS effect can be calculated by the following equations (3) and (4), respectively.

$$T_{d\_PSS} = \text{Re}[G_{\_PSS}(j\omega) \cdot G_{AVR^*}(j\omega)] \quad (3)$$
$$= K_{PSS}(\omega) \cdot K_{AVR^*}(\omega) \cdot \cos(\theta_{PSS}(\omega) + \theta_{AVR^*}(\omega))$$

$$T_{k\_PSS} = -(\omega/\omega_0) \cdot \text{Im}[G_{\_WPSS}(j\omega) \cdot G_{AVR^*}(j\omega)] \quad (4)$$
$$= -(\omega/\omega_0) \cdot K_{PSS}(\omega) \cdot K_{AVR^*}(\omega) \cdot \sin(\theta_{PSS}(\omega) + \theta_{AVR^*}(\omega))$$

In the above, ω is the frequency of input signal, $\omega_0$ is a reference frequency (a constant) of the power system, $G_{\_PSS}(j\omega)$ is a PSS transfer function, $G_{AVR^*}(j\omega)$ is a transfer function of the functional block 40, $K_{PSS}(\omega)$ is a gain function of the PSS transfer function, $K_{AVR^*}(\omega)$ is a gain characteristic of the transfer function of the functional block 40, $\theta_{PSS}(\omega)$ is the phase function of the PSS transfer function, and $\theta_{AVR^*}(\omega)$ is the phase characteristic of the transfer function of the functional block 40.

Since it is appropriate, for the purpose of control, to make zero the synchronous torque $T_{K\_PSS}$ by the PSS effect, we need only to obtain from Eq. (4)

$$\sin(\theta_{PSS}(\omega) + \theta_{AVR^*}(\omega)) = 0 \quad (5)$$

That is, $$\theta_{PSS}(\omega) = -\theta_{AVR^*}(\omega) \quad (6)$$

Substituting Eq. (6) into Eq. (3), we have $$T_{d\_PSS} = K_{PSS}(\omega) \cdot K_{AVR^*}(\omega) \quad (7)$$

Therefore, we have $$K_{PSS}(\omega) = T_{d\_PSS}(\omega)/K_{AVR^*}(\omega)$$

Further, from Eq. (1) we have $$K_{PSS}(\omega) = (T_d(\omega) - T_{d\_SYS} - T_{d\_AVR}(\omega))/K_{AVR^*}(\omega) \quad (8)$$

In view of the damping effect of the generator, we set $$T_d(\omega) = M \cdot \omega_n / 2$$

where M is a constant of the inertia of the generator and $\omega_n$ is the natural oscillation frequency of the system.

From Eqs. (6) and (8), ideal PSS frequency characteristics are such as given below.

$$\text{Gain}: K_{PSS}(\omega) = (T_d(\omega) - T_{d\_SYS} - T_{d\_AVR}(\omega))/K_{AVR^*}(\omega) \qquad (9)$$

$$\text{Phase}: \theta_{PSS}(\omega) = -\theta_{AVR^*}(\omega) \qquad (10)$$

The compensator needs only a stable function that approaches the characteristics given by Eqs. (9) and (10); the characteristics can easily be approximated by such a leading/lagging function as the transfer function $k(T_1S+1)/(T_2S+1)$ exemplified in FIG. 3. Incidentally, the leading/lagging function may be provided in several stages according to the accuracy required.

Next, the operation of this embodiment will described below.

When the signal $\Delta \omega$ representing the deviation of the rotational speed of the generator is input into the power system stabilizer PSS, noise components, except varying frequency components, of the power system oscillation within a 0.1 to 3 Hz range, are removed by the control signal processor 31. Then, the effective control signal component is input as the signal Y into the control signal processor 32.

The noise component due to the torsional vibration of the generator shaft, which has a frequency component very close to the frequency of the effective control signal component, is removed by the control signal processor 32. The remaining effective control signal component is fed as the signal $Y_a$ into the optimum compensator 33.

The optimum excitation system compensator 33 compensates for the phase and gain of the effective control signal component, by the transfer function characteristic of the leading/lagging function, in such a manner as to suppress power fluctuations at the vibration frequency and hence maintain the damping force of the generator at an appropriate value over the available frequency region. The effective control signal thus obtained is applied to the limiter 34.

The limiter 34 limits the input effective control signal to a signal of an output level within a predetermined range, and provides it as the output signal 35.

As described above, according to Embodiment 3, noise of the power system other than the varying frequency component can be removed by the control signal processor 31, and noise due to a signal of the generator shaft can also be removed by the control signal processor 32 without affecting the effective control signal. Further, the phase and gain of the effective control signal can be compensated by the optimum compensator 33 to maintain appropriate the damping force of the generator over the available frequency region.

EMBODIMENT 4

Figure 5:
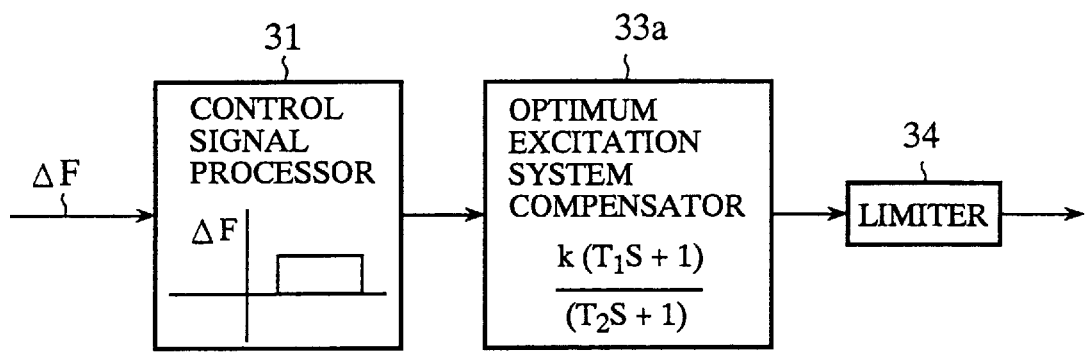
FIG. 5 is a block diagram illustrating a power system stabilizer according to a fourth embodiment of the present invention.

FIG. 5 illustrates in block form the power system stabilizer PSS according to a fourth embodiment (Embodiment 4) of the present invention. In FIG. 5, the parts corresponding to those in Embodiment 3 of FIG. 4 are marked with the same reference numerals as in the latter; no description will be given of them. In FIG. 5, $\Delta F$ denotes a signal representative of a frequency deviation of the generator voltage; and 33a denotes an optimum excitation system compensator (a compensation circuit) whose transfer function is $k(T_1S+1)/(T_2S+1)$.

The optimum compensator 33a in Embodiment 4 is basically identical with the optimum compensator 33 in Embodiment 3. Since $\omega = 2\pi f$, however, the transfer function $G_{fPSS}(j\omega)$ of this power system stabilizer PSS is given by $$G_{fPSS}(j\omega) = G_{\_PSS}(j\omega)/2\pi \qquad (12)$$

Hence, from Eqs. (6) and (8) in Embodiment 3, ideal gain and phase characteristics of the power system stabilizer PSS are as follows:

Ideal gain characteristic:

$$\begin{aligned} K_{fPSS}(\omega) &= K_{PSS}(\omega)/2\pi \qquad (13) \\ &= (T_{d\_PSS}(\omega)/K_{AVR^*}(\omega))/2\pi \\ &= (T_d(\omega) - T_{d\_SYS} - T_{d\_AVR}(\omega))/(2\pi K_{AVR^*}(\omega)) \end{aligned}$$

Phase characteristic: $\theta_{fPSS}(\omega) = \theta_{PSS}(\omega)$

This ideal characteristic is approximated using the leading/lagging function shown in the optimum compensator 33a in FIG. 5. The leading/lagging function may be provided in several stages in accordance with the accuracy required.

Next, the operation of this embodiment will be described below.

When the signal $\Delta F$ representing the deviation of the frequency of the generator voltage is input into the power system stabilizer PSS, low- and high-frequency noise components are removed by the control signal processor 31, the output of which is fed to the optimum excitation system compensator 33a.

The optimum excitation system compensator 33 compensates for the phase and gain of the effective control signal component based on the transfer function characteristic with the leading/lagging function, and the resulting effective control signal is applied to the limitern 34. The limiter 34 converts the input effective control signal to a signal having an output level within a predetermined range, and outputs it.

As described above, according to Embodiment 4, the high- and low-frequency noise components can be removed without causing a phase shift in the signal indicating the frequency deviation of the generator voltage. Further, the phase and gain of the effective control signal can be compensated for to maintain an appropriate damping force of the generator over the available frequency region.

EMBODIMENT 5

Figure 6:
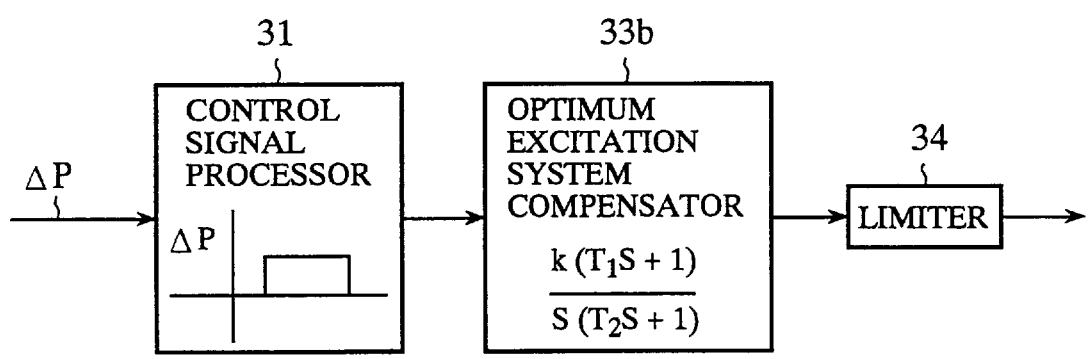
FIG. 6 is a block diagram illustrating a power system stabilizer according to a fifth embodiment of the present invention.
Figure 7:
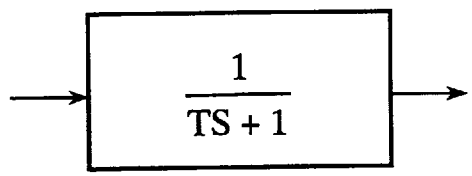
FIG. 7 is a block diagram depicting an example of a conventional high-frequency filter.
Figure 8:
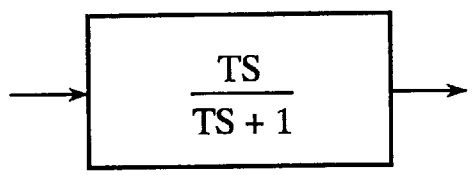
FIG. 8 is a block diagram depicting an example of a conventional low-frequency filter.
Figure 9:
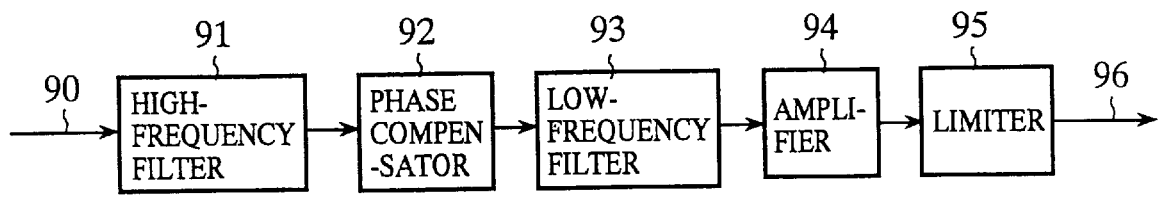
FIG. 9 is a block diagram depicting a conventional power system stabilizer.

FIG. 6 illustrates in block form a power system stabilizer PSS according to a fifth embodiment (Embodiment 5) of the present invention. In FIG. 6 the parts corresponding to those in Embodiment 3 shown in FIG. 4 are identified by the same reference numerals as in the latter; no description will be given of them. In FIG. 6, reference character $\Delta P$ denotes a signal representing the deviation of the active power of the generator; and 33b denotes an optimum excitation system compensator (a compensation circuit) whose transfer function is $k(T_1S+1)/S(T_2S+1)$. Incidentally, when the input signal is the active power of the generator, the reference value may vary; hence, the control signal processor 31 needs to be provided with the deviation resetter 1. The constant $T_r$ of the deviation resetter 1 is set at a value large enough to reduce the influence on the phase of the effective control signal.

The optimum excitation system compensator 33b in Embodiment 5 is basically identical with compensator 33 in Embodiment 3, but since the signal that is input thereto is the signal $\Delta P$ representing the deviation of the active power of the generator, the compensator 33b has the transfer function $k(T_1S+1)/S(T_2+1)$.

The transfer function $G_pPSS(j\omega)$ of the power system stabilizer of this embodiment is given by $$G_pPSS(j\omega) = G_{PSS}(j\omega) \cdot G_m(j\omega) \quad (14)$$

$$G_m(j\omega) \approx 1/M \cdot (j\omega) \quad (15)$$

From Eqs. (6) and (8), ideal PSS gain and phase characteristics are as follows:

Gain characteristic:

$$\begin{aligned}K_{pPSS}(\omega) &= |G_m(\omega)| \cdot K_{PSS}(\omega) \quad (16)\\ &= |G_m(\omega)| \cdot T_{d\_PSS}(\omega)/K_{AVR^*}(\omega)\\ &= (1/M\omega)(T_d(\omega) - T_{d\_SYS} - T_{d\_AVR}(\omega))/\\ &\quad K_{AVR^*}(\omega)\end{aligned}$$

Phase characteristic:

$$\theta_pPSS(\omega) = \theta_{PSS}(\omega) - \pi/2 = \theta_{AVR^*}(\omega) - \pi/2 \quad (17)$$

The ideal characteristics are implemented using the transfer function $k(T_1S+1)/(S(T_2+1))$ approximated by the integration function and the leading/lagging function. The leading/lagging function may be used in several stages according to the accuracy required.

Next, the operation of this embodiment will be described below.

When the signal $\Delta P$ indicating the deviation of the active power of the generator is input into the control signal processor 31, the constant deviation from reference is removed by the deviation resetter 1. The high- and low-frequency noise components of the signal $\Delta P$ having passed through the deviation resetter 1 are removed by the control signal processor 31. The phase and gain of the signal $\Delta P$ thus processed is compensated for by the optimum excitation system compensator 33b.

As described above, according to Embodiment 5, varying and noise components in the active power of the generator can be removed without causing a phase shift in or exerting any other bad influence on the effective control signal. Accordingly, the phase and gain of the effective control signal can be compensated for to maintain an appropriate damping force of the generator over the available frequency region.

While the preferred embodiments of the present invention have been described, it is to be understood that they are merely illustrative of the invention and that many modifications and variations may be effected without departing from the spirit and scope of the claims appended hereto.

What is claimed is:

1. A control signal processor comprising:
    a first filter circuit having a first double differentiation function characteristic for increasing values of frequency components of an input signal larger than a first boundary value;
    a second filter circuit having a second double differentiation function characteristic for increasing values of frequency components of the input signal smaller than the first boundary value but larger than a second boundary value; and
    a logic circuit deciding whether to permit or inhibit passage of the input signal based on the input signal and output signals from said first and second filter circuits.

2. The control signal processor of claim 1, wherein said logic circuit performs a logic operation which permits passage of frequency components of the input signal between the first and second boundary values.

3. The control signal processor of claim 1, wherein said logic circuit performs a logic operation which permits passage of frequency components of the input signal larger than the first boundary value and smaller than the second boundary value.

4. A power system stabilizer (PSS) comprising:
    a control signal processor including:
        a first filter circuit having a first double differentiation function characteristic for increasing values of frequency components of an input signal larger than a first boundary value;
        a second filter circuit having a second double differentiation function characteristic for increasing values of frequency components of the input signal smaller than the first boundary value but larger than a second boundary value; and
        a logic circuit deciding whether to permit or inhibit passage of the input signal based on the input signal and output signals from said first and second filter circuits; and
    a compensation circuit compensating gain and phase of an output signal from said control signal processor based on a transfer function that has a characteristic obtained by setting damping torque of a generator and making synchronous torque due to a PSS effect zero.

5. The power system stabilizer of claim 4, comprising a limiter for limiting the output signal from said compensation circuit to an output level within a range.

6. The power system stabilizer of claim 4, wherein said transfer function is approximated by at least one stage of leading/lagging functions.

7. The power system stabilizer of claim 4, wherein said transfer function is approximated by at least one stage of leading/lagging functions and an integration function.

8. The power system stabilizer of claim 4, wherein said logic circuit of said control signal processor performs at least one of a logic operation for passage of the frequency component of the input signal between the first and second boundary values and a logic operation for passage of the frequency components of the input signal larger than the first boundary value and smaller than the second boundary value.

* * * * *